United States Patent
Benson

(10) Patent No.: US 7,700,469 B2
(45) Date of Patent: Apr. 20, 2010

(54) METHODS OF FORMING SEMICONDUCTOR CONSTRUCTIONS

(75) Inventor: Russell A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 12/037,560

(22) Filed: Feb. 26, 2008

(65) Prior Publication Data

US 2009/0212338 A1   Aug. 27, 2009

(51) Int. Cl.
*H01L 21/22* (2006.01)

(52) U.S. Cl. .................. 438/552; 438/738; 438/243; 438/386

(58) Field of Classification Search ......... 438/443–446, 438/552–556, 672–673, 637–638, 700, 738–741, 438/243–249, 386–392
See application file for complete search history.

(56) References Cited

U.S. PATENT DOCUMENTS

| | | | |
|---|---|---|---|
| 5,445,990 | A | 8/1995 | Yook et al. |
| 6,358,864 | B1 | 3/2002 | Chang et al. |
| 6,624,018 | B1 * | 9/2003 | Yu et al. .................. 438/239 |
| 6,667,502 | B1 | 12/2003 | Agarwal et al. |
| 6,805,614 | B2 | 10/2004 | Kwok |
| 7,226,845 | B2 | 6/2007 | Manning et al. |
| 7,271,051 | B2 | 9/2007 | Manning et al. |
| 2003/0062543 | A1 | 4/2003 | Nakamura |
| 2005/0042880 | A1 | 2/2005 | Kwok |
| 2005/0139935 | A1 | 6/2005 | Lee |
| 2006/0202261 | A1 | 9/2006 | Lue et al. |
| 2006/0261440 | A1 | 11/2006 | Manning |
| 2007/0087525 | A1 | 4/2007 | Chen et al. |

(Continued)

FOREIGN PATENT DOCUMENTS

KR      20010058485      7/2001

(Continued)

OTHER PUBLICATIONS

Falong Zhou et al. "VDNROM: A Novel Four-Bits-Per-Cell Vertical Channel Dual-Nitride-Trapping-Layer ROM for High Density Flash Memory Applications" IEEE, Apr. 2006, pp. 226-229.

(Continued)

*Primary Examiner*—Dung A. Le
(74) *Attorney, Agent, or Firm*—Wells St. John P.S.

(57) ABSTRACT

Some embodiments include methods of forming semiconductor constructions. Oxide is formed over a substrate, and first material is formed over the oxide. Second material is formed over the first material. The second material may be one or both of polycrystalline and amorphous silicon. A third material is formed over the second material. A pattern is transferred through the first material, second material, third material, and oxide to form openings. Capacitors may be formed within the openings. Some embodiments include semiconductor constructions in which an oxide is over a substrate, a first material is over the oxide, and a second material containing one or both of polycrystalline and amorphous silicon is over the first material. Third, fourth and fifth materials are over the second material. An opening may extend through the oxide; and through the first, second, third, fourth and fifth materials.

20 Claims, 15 Drawing Sheets

U.S. PATENT DOCUMENTS

| | | |
|---|---|---|
| 2007/0173030 A1 | 7/2007 | Manning |
| 2007/0221981 A1 | 9/2007 | Saeki |
| 2007/0268753 A1 | 11/2007 | Lue et al. |
| 2007/0284620 A1 | 12/2007 | Lue et al. |
| 2007/0292696 A1 | 12/2007 | Chidambarrao et al. |
| 2007/0297244 A1 | 12/2007 | Wu |
| 2007/0298568 A1 | 12/2007 | Mokhlesi |
| 2008/0017916 A1 | 1/2008 | Kanetaka |
| 2008/0020533 A1 | 1/2008 | Thei et al. |
| 2008/0023751 A1* | 1/2008 | Joshi et al. .................. 257/324 |
| 2008/0029828 A1 | 2/2008 | Oh et al. |

FOREIGN PATENT DOCUMENTS

| | | |
|---|---|---|
| KR | 20030001884 | 1/2003 |
| KR | 20040007798 | 1/2004 |
| KR | 20040102720 | 12/2004 |
| KR | 20050002034 | 1/2005 |
| KR | 20050002479 | 1/2005 |
| WO | PCT/US09/32119 | 9/2009 |

OTHER PUBLICATIONS

Ru Huang, et al. "A Novel Silicon-Based Flash Cell Structures for Low Power and High Density Memory Applications (invited)" IEEE, May 2006, 4 pages.

Tzu-Hsuan Hsu, et al. "A High-Performance Body-Tied FinFET Bandgap Engineered SONOS (BE-SONOS) for NAND-Type Flash Memory" IEEE Electron Device Letters, vol. 28, No. 5, May 2007, pp. 443-445.

Yueran Liu, et al. "Improved Performance of SiGe Nanocrystal Memory With VARIOT Tunnel Barrier" IEEE Transactions on Electron Devices, vol. 53, No. 10, Oct. 2006, pp. 2598-2602.

John Chi-Hung Hui, et al. "Sealed-Interface Local Oxidation Technology" IEEE Transactions on Electron Devices, vol. ED-29, No. 4, Apr. 1982, pp. 554-561.

Yung-Hsien Wu, et al. "Oxide-Nitride Storage Dielectric Formation in a Single-Furnace Process for Trench DRAM" IEEE Electron Device Letters, vol. 27, No. 9, Sep. 2006, pp. 734-736.

* cited by examiner

METHODS OF FORMING SEMICONDUCTOR CONSTRUCTIONS

TECHNICAL FIELD

Semiconductor constructions, and methods of forming semiconductor constructions.

BACKGROUND

Integrated circuit fabrication may involve formation of high aspect ratio openings. Such openings may be utilized for fabrication of various circuit devices, such as, for example, capacitors. An advantage of forming the circuit devices within the high aspect ratio openings may be that the devices can then be made to occupy a relatively small footprint of a semiconductor wafer substrate. For instance, capacitors formed in high aspect ratio openings may have the same capacitive capacity as other capacitors, but may be formed to be very tall and thin so that individual capacitors occupy very little semiconductor real estate.

Difficulties may occur in forming tall, thin capacitors in that the capacitors may be prone to toppling. Various methods have been developed for avoiding toppling of tall, thin capacitors, with some of such methods comprising formation of a supporting lattice structure that assists in retaining the capacitors in a desired orientation. Some example lattice structures are described in U.S. Pat. Nos. 7,226,845 and 7,271,051; as well as in U.S. Publication Number 2006/0261440.

An example prior art process for forming openings extending through a lattice structure is described with reference to FIGS. 1 and 2.

FIG. 1 shows a semiconductor construction 10 at an early process stage of the process. The construction 10 comprises a semiconductor substrate, or base, 12. Substrate 12 can comprise, consist essentially of, or consist of, for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The semiconductor substrate 12 supports a pair of transistors 14 and 16. The transistor 14 comprises a gate 18 and a pair of source/drain regions 20 and 22. The source/drain regions extend into base 12, and may be either n-type majority doped or p-type majority doped. The gate 18 comprises a gate dielectric 24, a conductive segment 26, and an insulative cap 28. The gate dielectric may comprise, for example, silicon dioxide; the conductive segment 26 may comprise one or more of conductively-doped semiconductor material, metals, and metal-containing compounds; and the insulative capping layer may comprise, for example, silicon nitride.

A pair of sidewall spacers 30 extend along the opposing sidewalls of the gate 18, and such sidewall spacers may comprise, for example, silicon nitride.

The transistor 16 comprises a gate 32, source/drain region 22, and another source/drain region 34. The source/drain region 34 extends into base 12, and may be either n-type majority doped or p-type majority doped. The gate 32 comprises the gate dielectric 24, conductive segment 26, and insulative cap 28 discussed previously; and sidewall spacers 30 are along opposing sidewalls of the gate.

Isolation regions 19 extend into substrate 12 adjacent source/drain regions 20 and 34. The isolation regions may correspond to shallow trench isolation regions, and may contain silicon dioxide. The isolation regions may electrically isolate source/drain regions 20 and 34 from other circuitry (not shown).

An electrically insulative material 36 extends over and between the transistors 14 and 16. Electrically conductive pedestals 38, 40 and 42 extended through the electrically insulative material 36 to electrically connect with source/drain regions 20, 22 and 34, respectively.

A stack 44 is over the insulative material 36 and pedestals 38, 40 and 42. The stack comprises a first oxide-containing material 46, a first layer 48 of silicon nitride, a second oxide-containing material 50, and a second layer 52 of silicon nitride. The layers 48 and 52 ultimately become lattices to assist in retaining capacitors. The oxide-containing materials 46 and 50 may consist of silicon dioxide, or may consist of doped silicon dioxide (for instance, borophosphosilicate glass, phosphosilicate glass, fluorosilicate glass, etc.).

Transparent carbon 54 is over the second layer 52 of silicon nitride, deposited antireflective coating (DARC) 56 is over transparent carbon 54, bottom antireflective coating (BARC) 58 is over the DARC, and photolithographically-patterned photoresist 60 is over the BARC. The DARC may comprise, for example, silicon oxynitride; and the BARC may comprise any of various organic materials (i.e., may contain carbon).

The patterned photoresist defines a pair of openings 62 and 66.

FIG. 2 shows construction 10 after the openings 62 and 66 are extended through stack 44 with a plurality of etches, and after the transparent carbon 54 (FIG. 1), DARC 56 (FIG. 1), BARC 58 (FIG. 1) and photoresist 60 (FIG. 1) have been removed. The etches may comprise one more etches to extend through the BARC 58 and DARC 56 to the transparent carbon 54, followed by a dry etch utilizing $O_2/SO_2$ to penetrate through the transparent carbon. Such dry etch may also remove the photoresist 60 and the BARC 58. A subsequent etch may utilize $CH_2F_2$, $CHF_3$ and $O_2$ to penetrate the upper nitride layer 52, and to remove the DARC 56. Next, $C_4F_6$, $O_2$ and Ar may be utilized to pass through the top oxide-containing material 50. An etch comprising $CHF_3$, $O_2$, $CH_2F_2$ and Ar may then be utilized to punch through the second nitride layer 48 and partially into the bottom oxide-containing material 46. Finally, $C_4F_6$, $O_2$ and Ar may be utilized to remove a remaining portion of the bottom oxide-containing material 46 to form the shown openings. The transparent carbon 54 (FIG. 1) may be removed after the etching has passed through the top nitride layer 52 utilizing oxidation with $O_2$, or any other suitable conditions.

A problem that may occur during the transfer of openings 62 and 66 into stack 44 is that bowing may occur in the top oxide-containing material 50, as is diagrammatically illustrated by curved regions 51 along sidewalls of material 50 within openings 62 and 66. Such bowing may result from any of various mechanisms, such as, for example, etching of material 50 during the etch through material 46, thinning of layer 52, etc.

Ultimately, capacitors are to be formed within openings 62 and 66 by depositing capacitor storage node material, capacitor dielectric material and capacitor plate material within the openings. The bowing within openings 62 and 66 complicates such capacitor fabrication.

It would be desired to develop new methods of capacitor fabrication which avoid the problems shown in FIG. 2.

DETAILED DESCRIPTION OF THE ILLUSTRATED EMBODIMENTS

In some embodiments, the invention includes methods of forming high aspect ratio openings, and in some embodiments the invention further includes methods of forming capacitor structures within the high aspect ratio openings. Example embodiments are described with reference to FIGS. 3-17.

Figure 1:
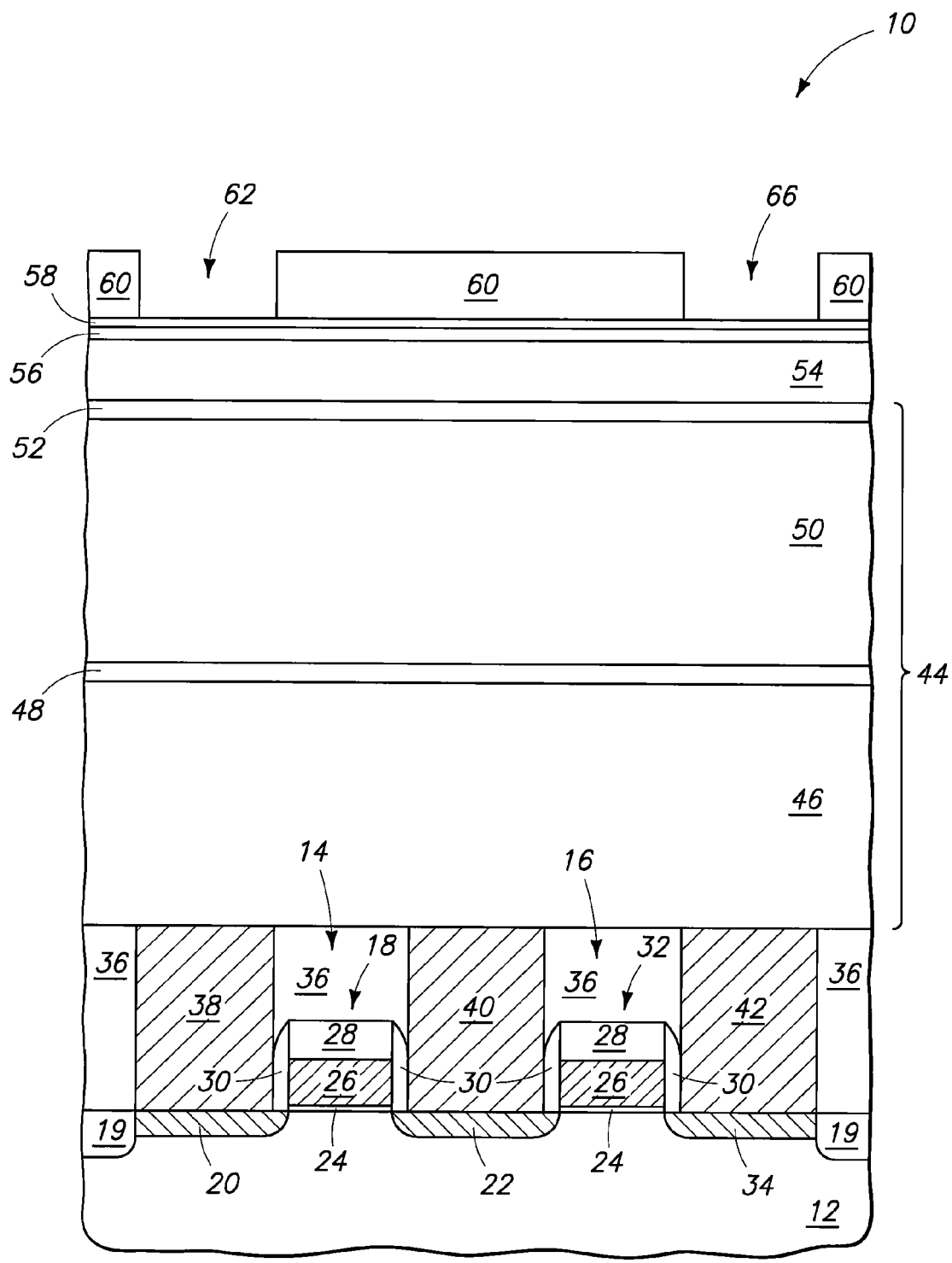
FIGS. 1 and 2 are diagrammatic, cross-sectional views of a portion of a semiconductor construction at various process stages of a prior art fabrication process.
Figure 2:
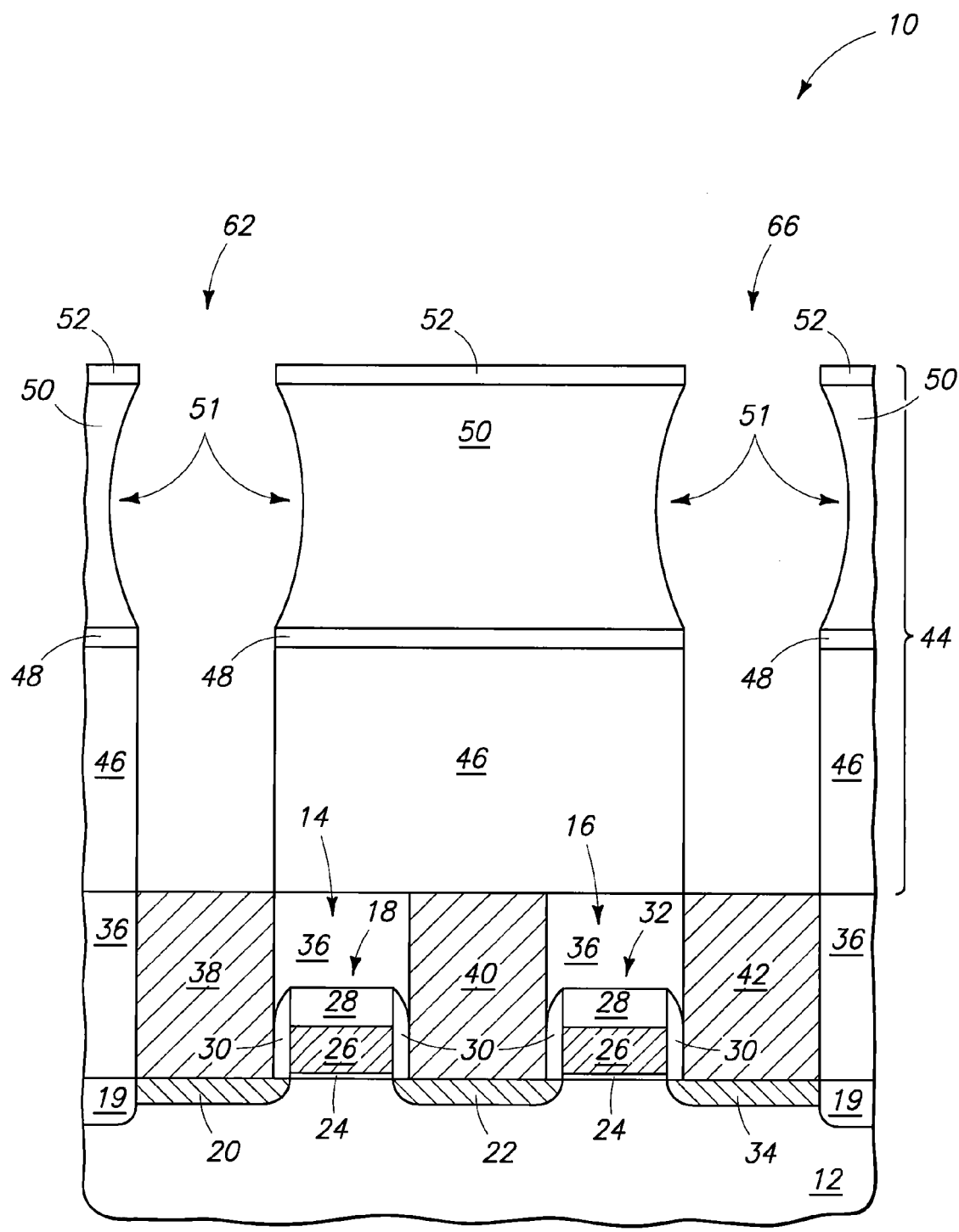
Figure 3:
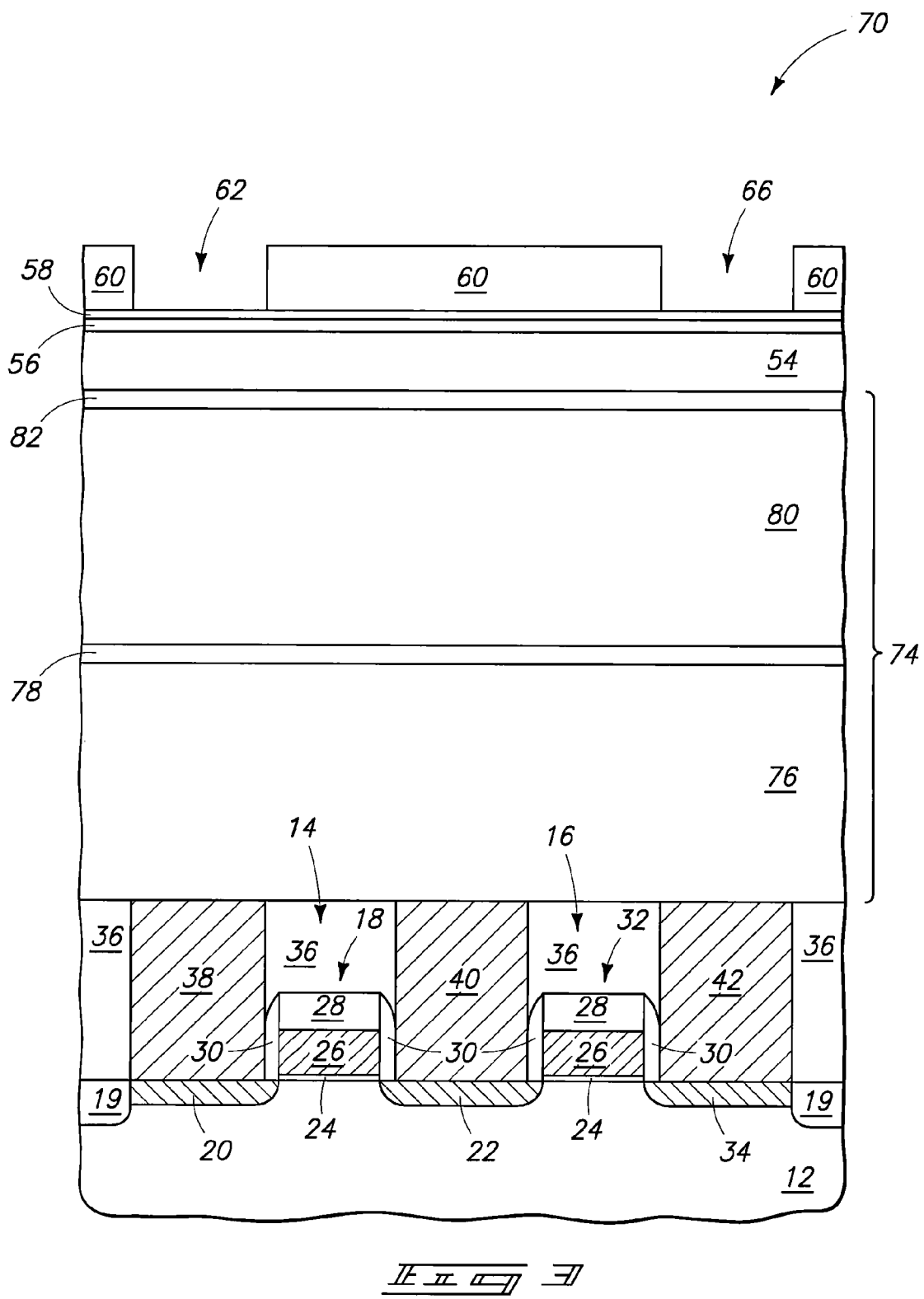
FIGS. 3-9 are diagrammatic, cross-sectional views of a portion of a semiconductor construction at various process stages in accordance with an embodiment.

Referring to FIG. 3, a semiconductor construction 70 is illustrated. In referring to construction 70, similar numbering will be used as is utilized above to describe prior art construction 10 of FIGS. 1 and 2, where appropriate.

Construction 70 comprises the semiconductor base material, or substrate, 12 described above, and comprises the paired transistors 14 and 16. The transistor 14 comprises the gate 18, and the pair of source/drain regions 20 and 22; and the transistor 16 comprises the gate 32, together with source/drain regions 22 and 34. The sidewall spacers 30 are along opposing sidewalls of the gates; and the isolation regions 19 are adjacent source/drain regions 20 and 34. The electrically insulative material 36 extends over and between the transistors 14 and 16; and the electrically conductive pedestals 38, 40 and 42 extended through electrically insulative material 36 to electrically connect with source/drain regions 20, 22 and 34, respectively.

A stack 74 is over the insulative material 36 and pedestals 38, 40 and 42. The stack 74 comprises materials 76, 78, 80 and 82. Materials 76 and 78 may be similar to the materials 46 and 48 of prior art FIGS. 1 and 2. Accordingly, material 76 may be an oxide-containing material, and material 78 may be an electrically insulative nitride-containing material. The oxide-containing material 76 may comprise, consist essentially of, or consist of silicon dioxide, or a doped oxide (for instance, borophosphosilicate glass, phosphosilicate glass, fluorosilicate glass, etc.); and nitride-containing material 78 may comprise, consist essentially of, or consist of silicon nitride. Material 76 may be formed to a thickness of at least about 10,000 angstroms (for instance, about 15,000 angstroms); and material 78 may be formed to a thickness of from about 250 angstroms to about 500 angstroms.

Stack 74 differs from the stack 44 of the prior art (FIG. 1) in that stack 74 comprises a non-oxidized silicon-containing material 80 over the nitride-containing material 78. Silicon-containing material 80 may comprise, consist essentially of, or consist of one or both of polycrystalline silicon and amorphous silicon. Such silicon may be conductively doped in some embodiments, and may not be conductively doped in other embodiments. The silicon-containing material may be selectively etchable relative to the nitride-containing material 78. Silicon-containing material 80 may be formed to a thickness of, for example, at least about 3000 angstroms, and in some embodiments may be formed to a thickness of from about 3000 angstroms to about 10,000 angstroms.

Stack 74 further comprises a capping material 82 formed over the silicon-containing material 80. Material 82 may be electrically insulative in some embodiments, and may be electrically conductive in other embodiments.

If material 82 is electrically insulative, the material may comprise any suitable composition to which materials 76 and 80 may be selectively etched, and may, for example, comprise, consist essentially of, or consist of silicon nitride. Accordingly, in some embodiments, materials 82 and 78 may both consist of silicon nitride, and may thus be the same composition as one another.

If material 82 is electrically conductive, the material may comprise any suitable composition to which materials 76 and 80 may be selectively etched, and may, for example, comprise metal (for instance, tungsten, titanium, etc.) or metal-containing compositions (for instance, metal nitride, metal suicide, etc.).

Material 82 may be formed to a thickness of at least about 1000 angstroms (for instance, to a thickness of about 1300 angstroms).

The materials 78, 80 and 82 may be referred to as first, second and third materials, respectively, that are formed over the oxide-containing material 76. In the shown embodiment, the first material 78 is directly against oxide-containing material 76 (in other words, there are no intervening materials between first material 78 and oxide-containing material 76); second material 80 is directly against first material 78; and third material 82 is directly against second material 80.

Transparent carbon 54, DARC 56, BARC 58, and photolithographically-patterned photoresist 60 are formed over material 82.

The patterned photoresist defines a mask having the pair of openings 62 and 66 extending therethrough.

Figure 4:
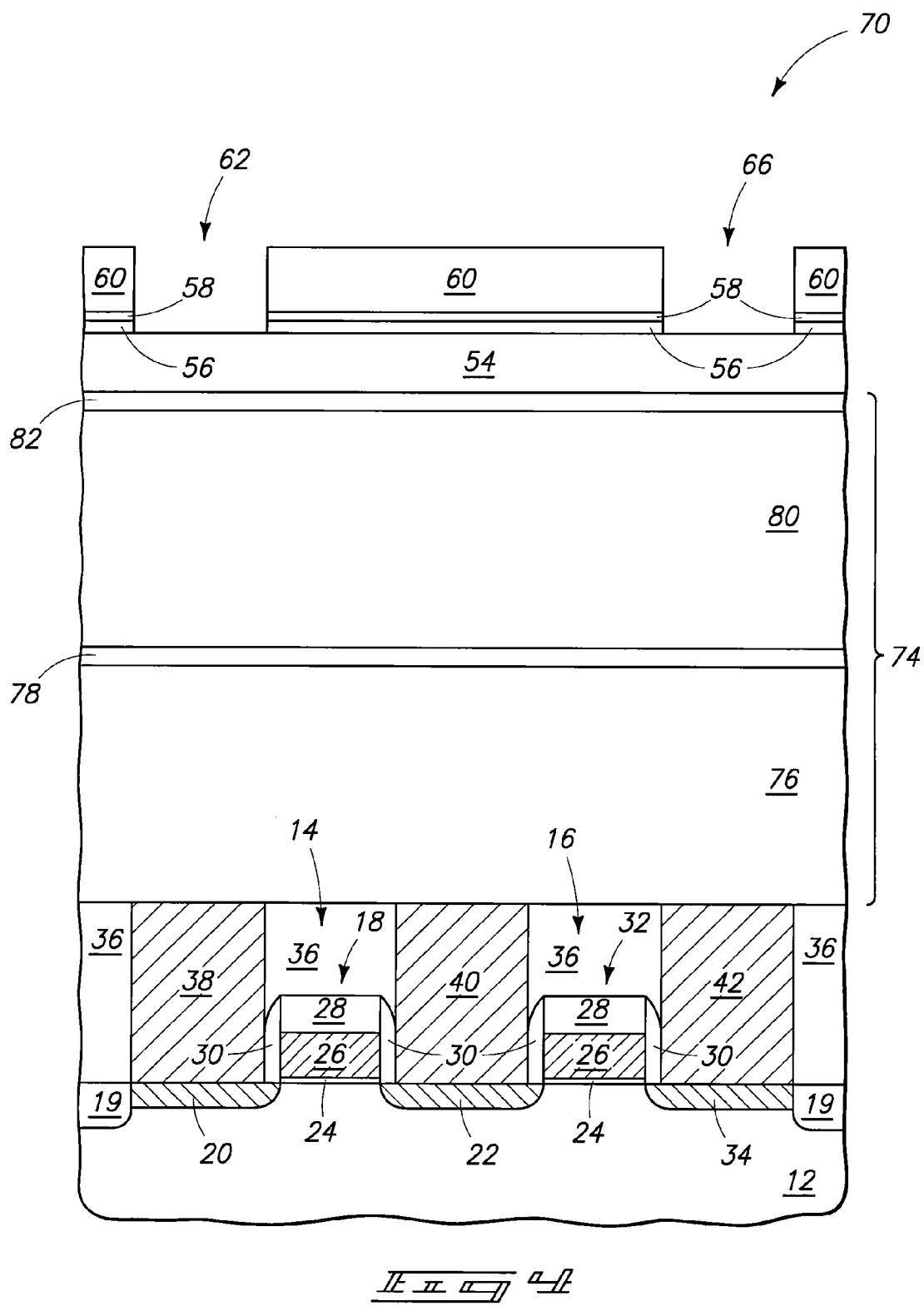

Referring to FIG. 4, openings 62 and 66 are extended through BARC 58 and DARC 56, to an upper surface of transparent carbon 54. The extension of openings 62 and 66 into BARC 58 and DARC 56 may be considered a transfer of a pattern from mask 60 into the underlying materials.

Figure 5:
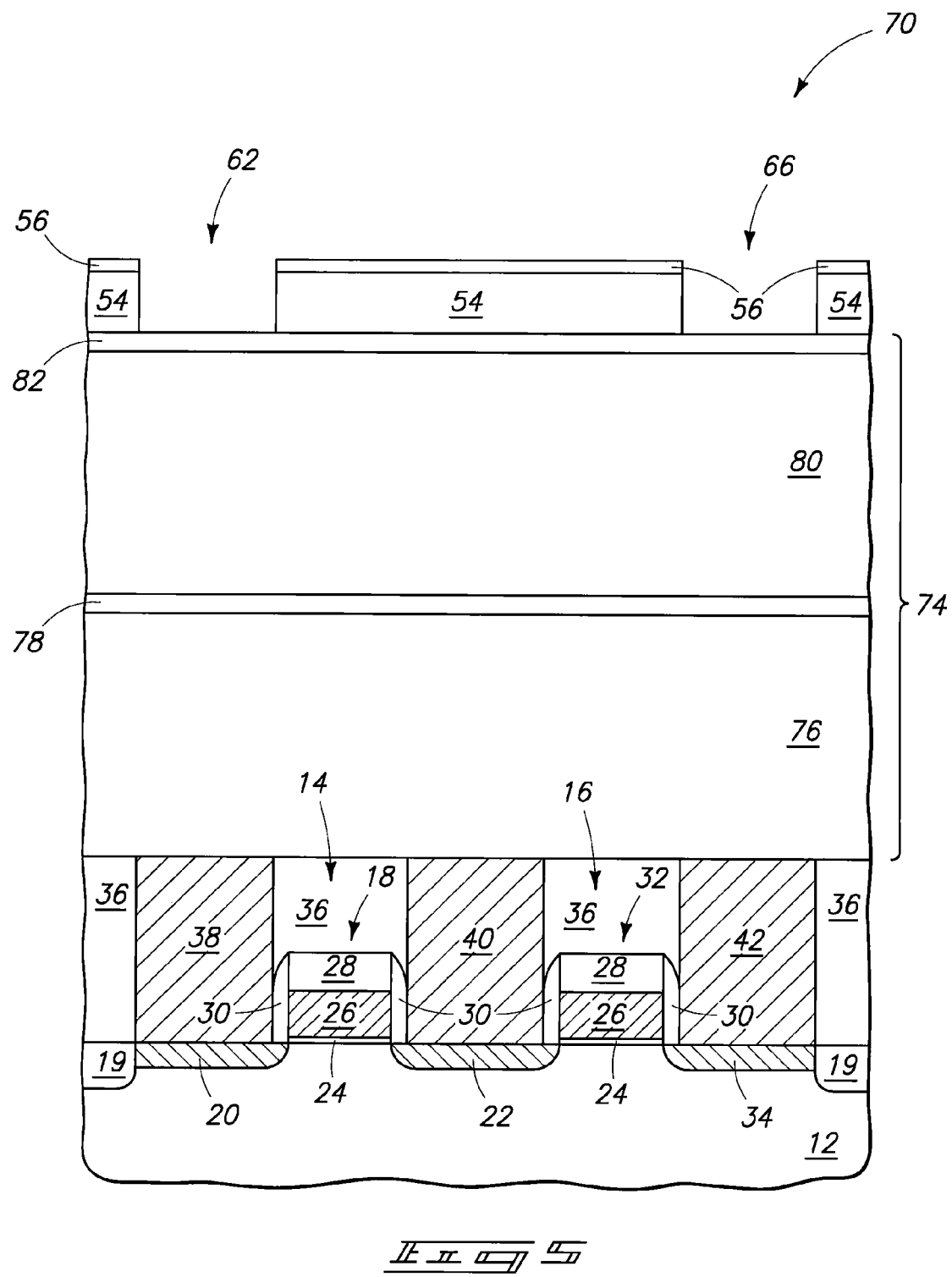

Referring to FIG. 5, openings 62 and 66 are extended through transparent carbon 54 with, for example, a dry etch utilizing $O_2/SO_2$. Such dry etch may also remove the photoresist 60 (FIG. 4) and the BARC 58 (FIG. 4), as shown.

Figure 6:
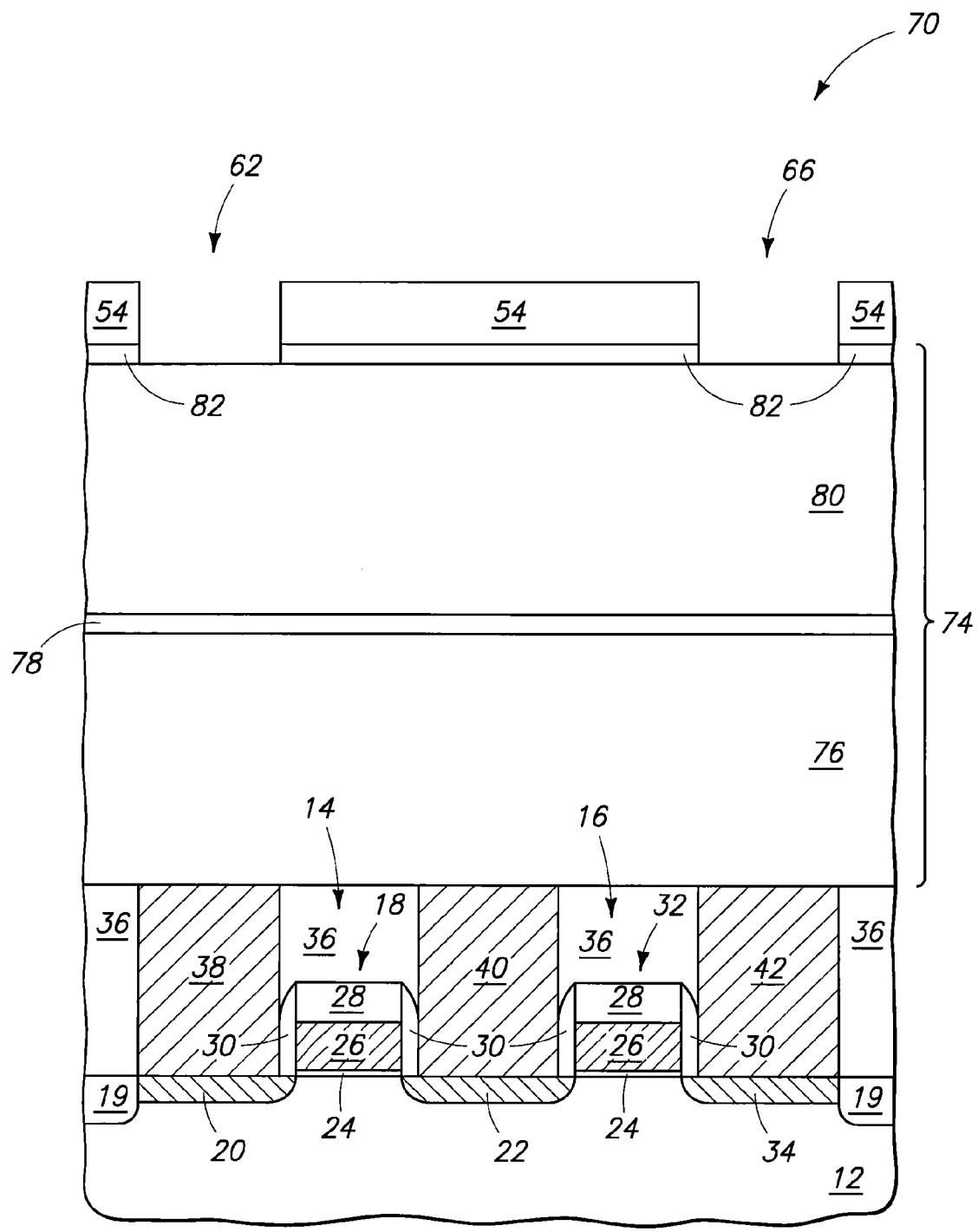

Referring to FIG. 6, an etch is utilized to extend openings 62 and 66 through material 82. If material 82 consists of silicon nitride, a suitable etch may utilize $CH_2F_2$, $CHF_3$, Ar and $O_2$. The etch through material 82 may also remove the DARC 56 (FIG. 5), as shown.

Figure 7:
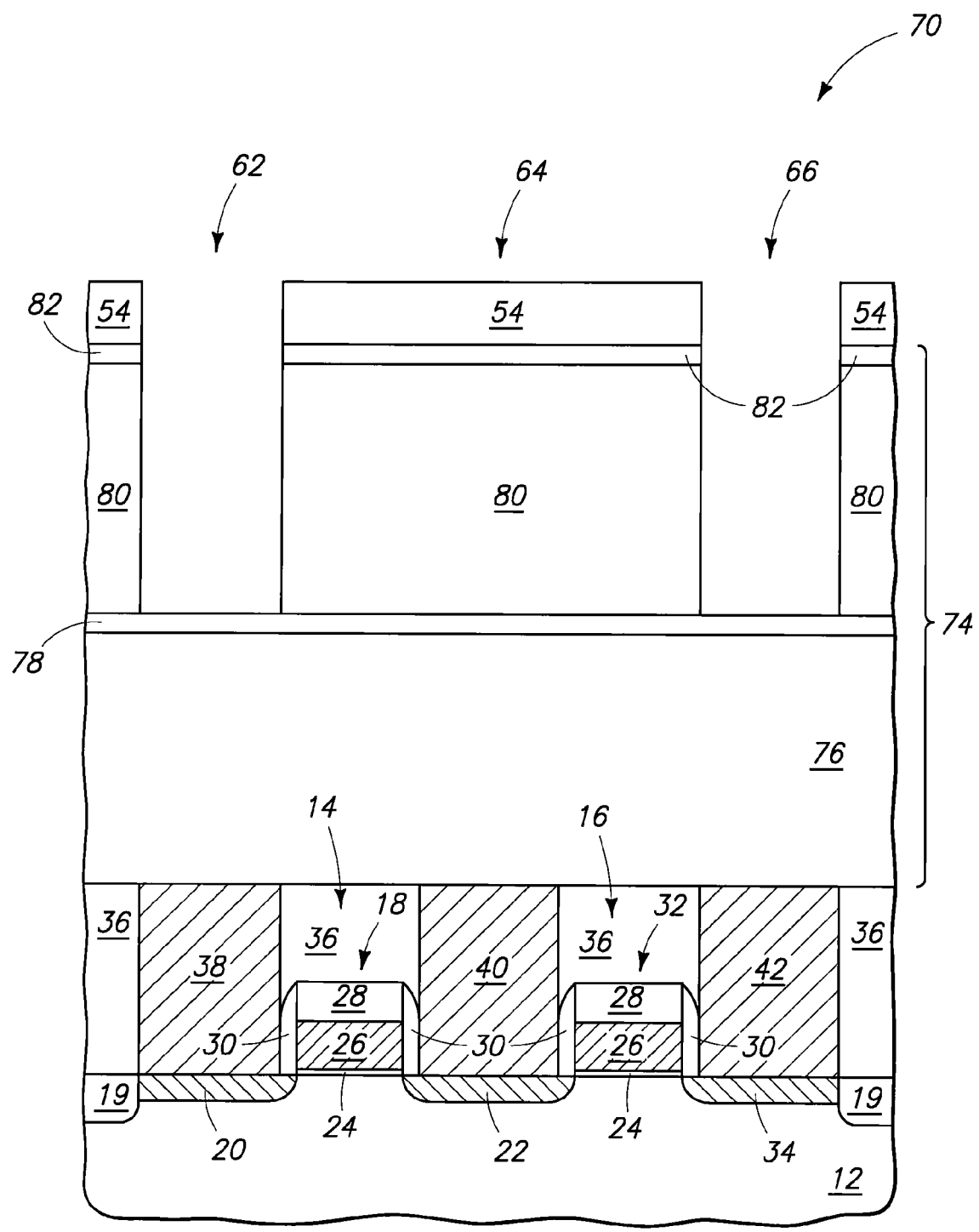

Referring to FIG. 7, the openings 62 and 66 are extended through silicon-containing material 80. The etch utilized to extend the openings through the silicon-containing material may utilize any suitable silicon-etching technology, and may, for example, utilize $O_2$ in combination with one or more fluorocarbons, $Cl_2$ and/or HBr.

Figure 8:
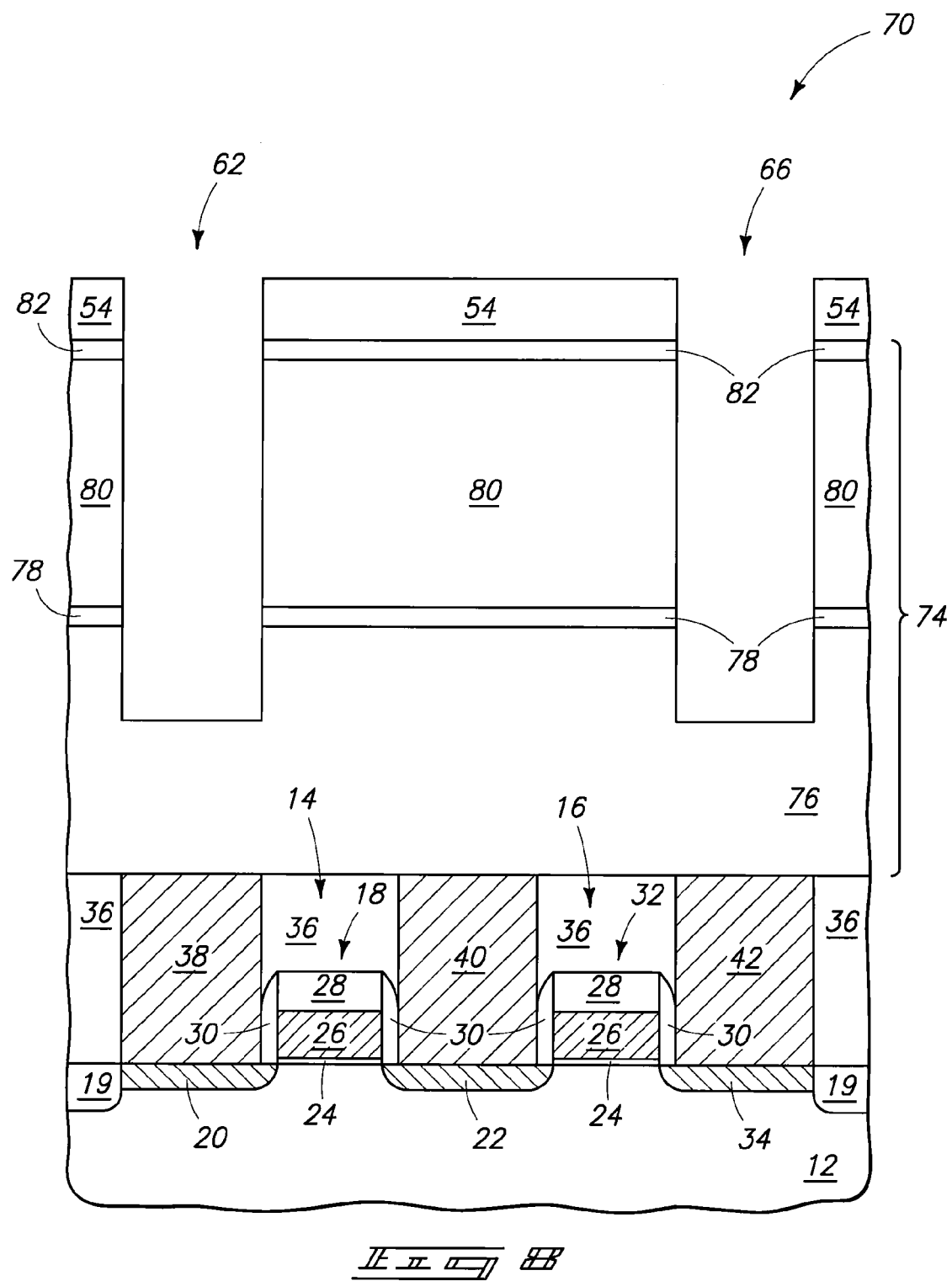

Referring to FIG. 8, openings 62 and 66 are extending through material 78, and partially into oxide-containing material 76. The etch through material 78 may be referred to as a second nitride etch to distinguish it from a first nitride etch that had been utilized to penetrate through material 82. The second nitride etch may comprise the same conditions as those utilized for the first nitride etch. In some embodiments, the etch through material 78 may utilize $CHF_3$, Ar, $O_2$ and $CH_2F_2$.

Figure 9:
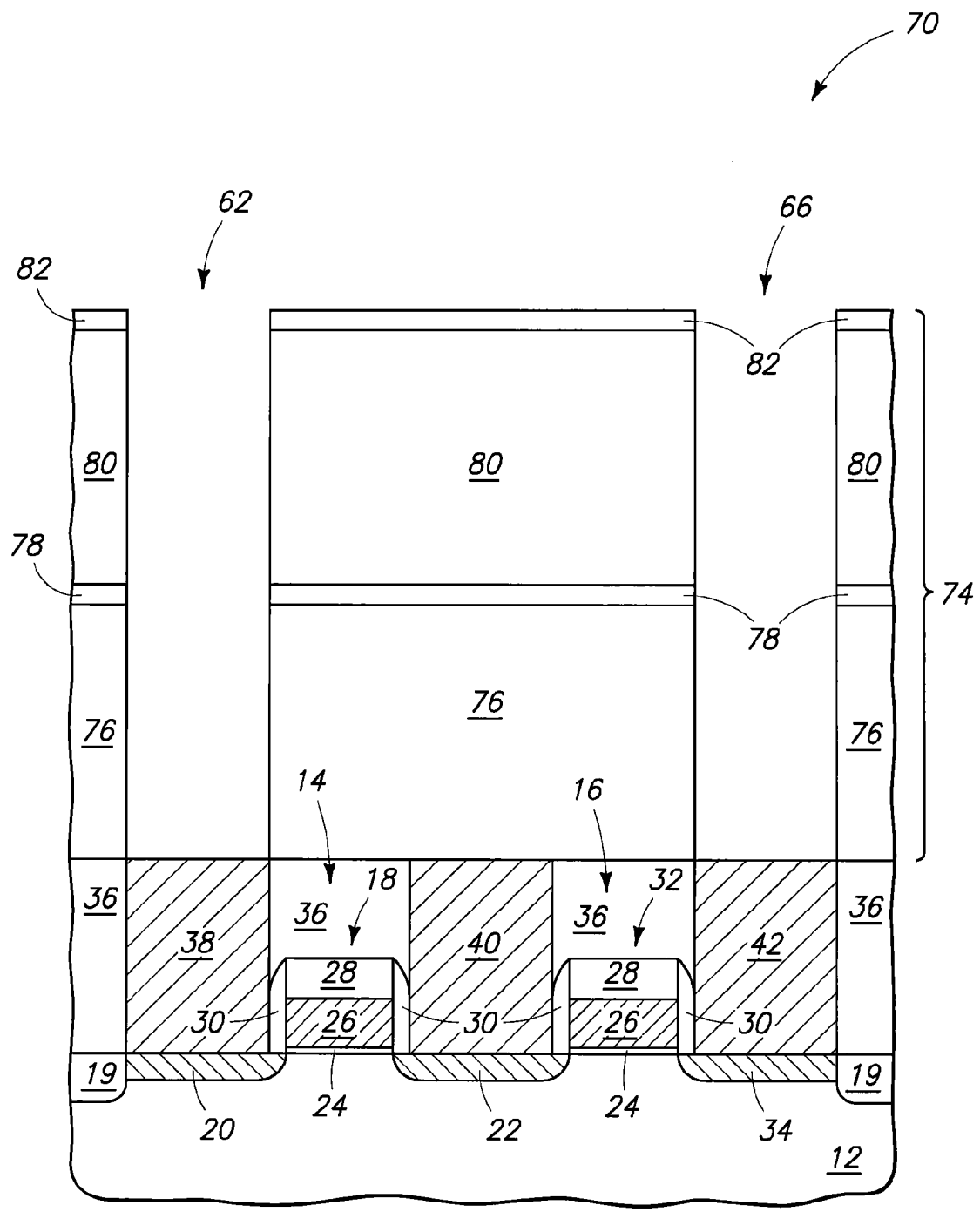

Referring to FIG. 9, openings 62 and 66 are extended through a remaining portion of the oxide-containing material 76. The etch through the remaining portion of the oxide-containing material may utilize $C_4F_6$ and $O_2$.

The transparent carbon 54 (FIG. 8) is removed at the processing stage of FIG. 9. The transparent carbon may be removed utilizing oxidation with $O_2$, or any other suitable conditions.

The construction 70 of FIG. 9 is at a similar processing stage to the prior art construction 10 of FIG. 2, but advantageously does not have the prior art bowing problem discussed with reference to FIG. 2. In some embodiments, the bowing may be entirely eliminated, and in other embodiments the bowing may be alleviated although not entirely eliminated. Regardless, alleviation or elimination of the bowing problem can improve subsequent process steps of forming capacitors or other circuitry within openings 62 and 66. Another prior art problem which may be alleviated or eliminated by the processing of FIGS. 3-9 is a problem referred to as twisting, where pillars adjacent an opening rotate about axes extending through the pillars, or where walls adjacent an opening bend along planes extending through the walls. The elimination or alleviation of twisting may also improve subsequent process steps of forming capacitors or other circuitry within openings 62 and 66.

Figure 10:
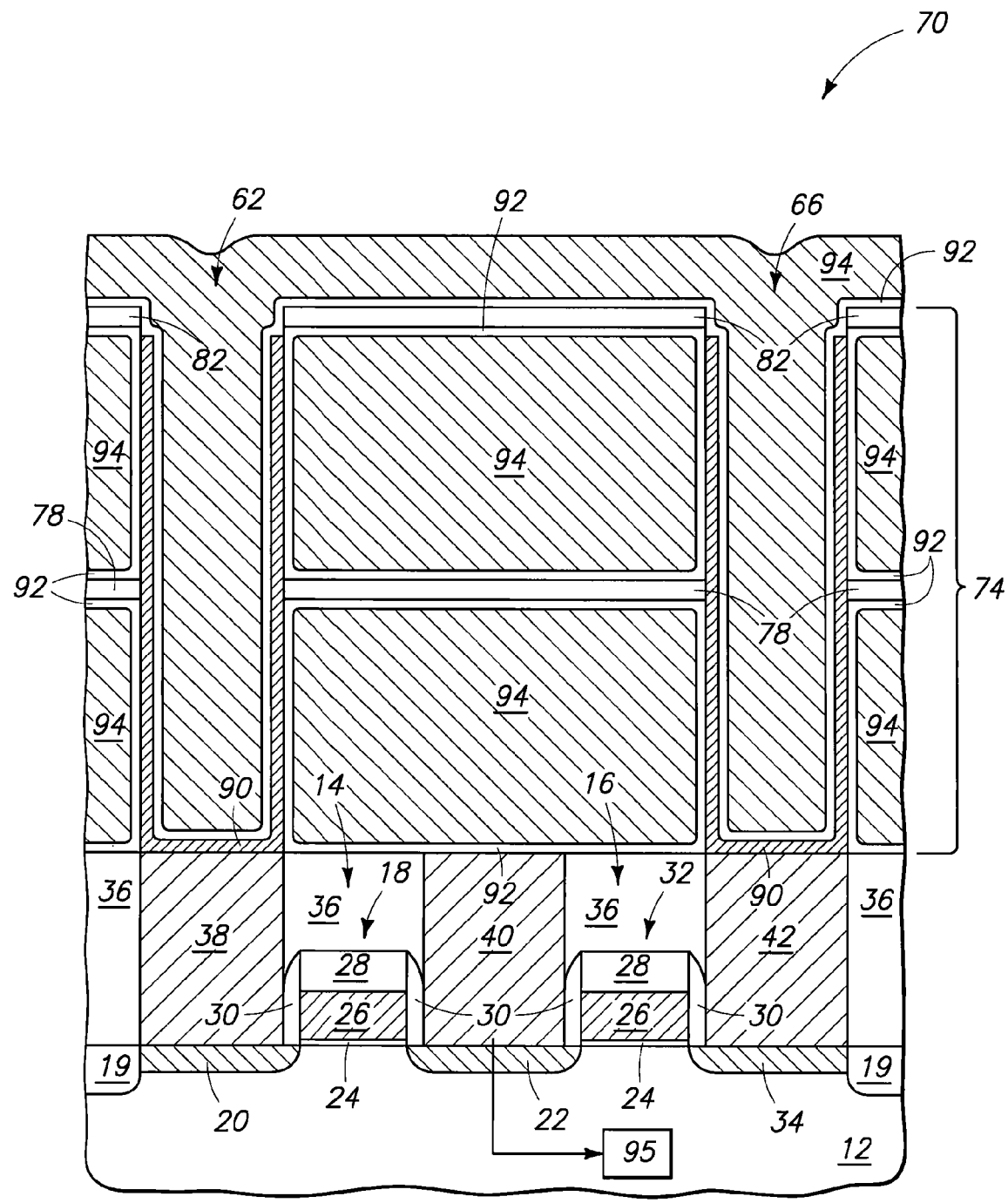
FIG. 10 is a diagrammatic, cross-sectional view of a portion of a semiconductor construction in accordance with an embodiment.
Figure 11:
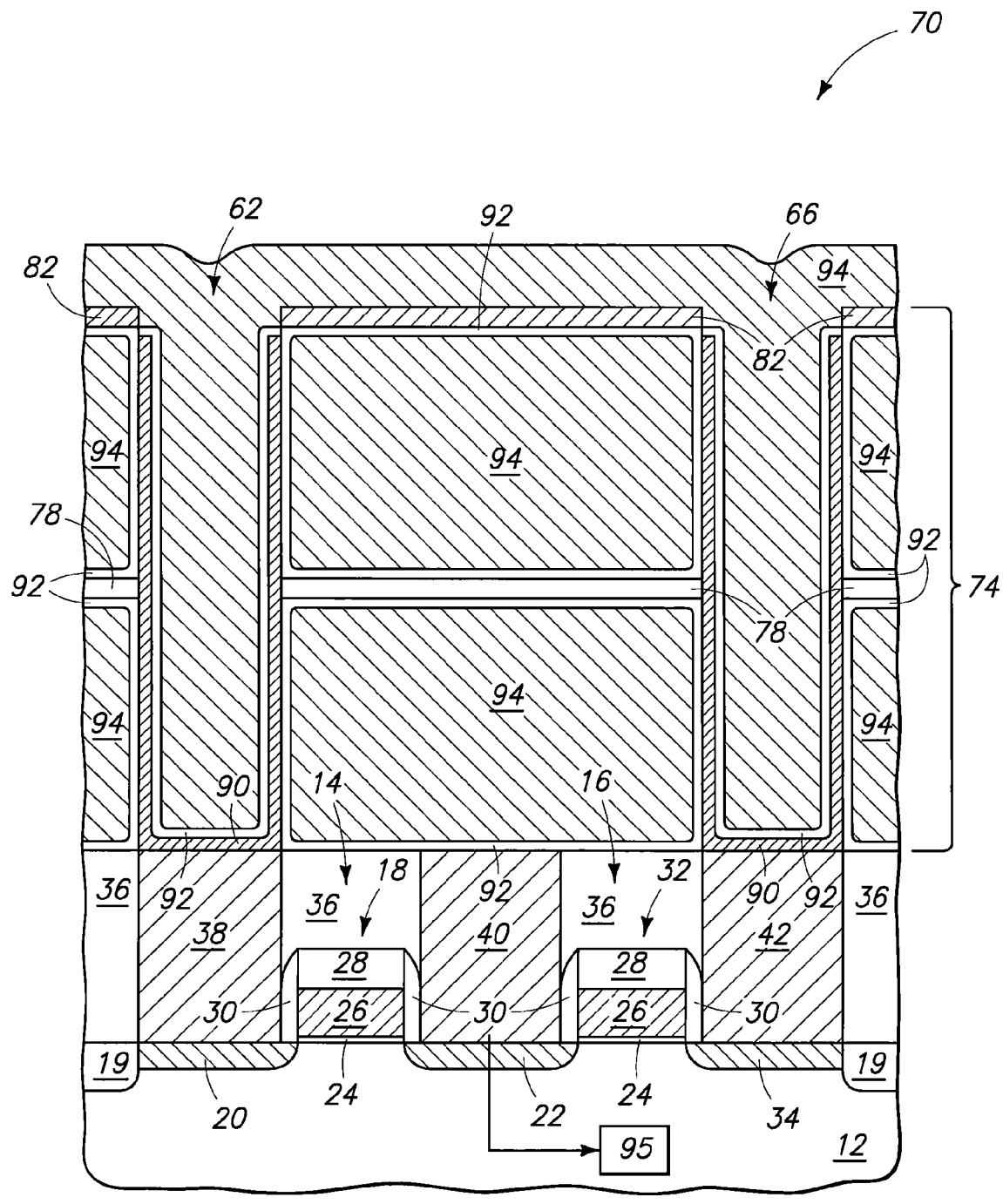
FIG. 11 is a diagrammatic, cross-sectional view of a portion of a semiconductor construction in accordance with an embodiment.

If capacitors are formed within openings 62 and 66, such capacitors may have any suitable configuration, and may, for example, be pillar-type capacitors or container-type capacitors. FIGS. 10 and 11 illustrate example embodiments of container-type capacitors the may be formed within openings 62 and 66.

Referring to FIG. 10, capacitor storage node material 90 is formed within openings 62 and 66, and in electrical connection with pillars 38 and 42. The capacitor storage node material may comprise any suitable electrically conductive composition, or combination of electrically conductive compositions; and may, for example, comprise one or more of conductively-doped semiconductor materials (for instance, conductively-doped silicon, etc.), metals (for instance, titanium, tungsten, platinum, etc.) and metal-containing compounds (for instance, metal silicides, metal nitride, etc.). The storage node material is patterned so that the material is within the openings, but does not extend outwardly the openings.

After the capacitor storage node material 90 is formed, at least some of the materials 76 and 80 (FIG. 9) may be removed. At least portions of materials 76 and 80 may thus be sacrificial in some embodiments. After portions of materials 76 and 80 are removed, only lattice materials 78 and 82 remain to laterally support the storage node material.

Capacitor dielectric material 92 is formed within openings 62 and 66, and over storage of material 90. The capacitor dielectric material may be formed on both sides of the storage nodes in the shown cross-sectional view due to the portions of materials 76 and 80 (FIG. 9) having been removed. The capacitor dielectric material may comprise any suitable electrically insulative composition or combination of electrically insulative compositions; and may, for example, comprise silicon dioxide, silicon nitride, and/or any of various high-k materials (with high-k materials being materials having a dielectric constant greater than that of silicon dioxide).

Capacitor plate material 94 is formed over the capacitor dielectric material and within openings 62 and 66. The capacitor plate material may be formed on both sides of the storage nodes in the shown cross-sectional view due to the portions of materials 76 and 80 (FIG. 9) having been removed. The capacitor plate material may comprise any suitable electrically conductive composition or combination of electrically conductive compositions; and may, for example, comprise one or more of materials discussed above as being suitable for capacitor storage node material 90.

The embodiment of FIG. 10 may be considered to comprise dynamic random access (DRAM) unit cells containing the capacitors and transistors. The central pedestal 40 may be electrically connected with a bitline 95. Accordingly, the embodiment of FIG. 10 may comprise a pair of DRAM unit cells sharing a connection to a bitline. Such DRAM unit cells may be representative of large number of DRAM unit cells simultaneously fabricated as a DRAM array.

The embodiment of FIG. 10 has the dielectric material 92 extending across capping layer 82. In other embodiments, the dielectric material may be contained within openings 62 and 66 so that the capping material direct the contacts capacitor plate material 94. If the capping material 82 comprises an electrically conductive composition, such may advantageously become part of the capacitor plate that extends across construction 70. FIG. 11 shows an embodiment in which the capping material 82 comprises an electrically conductive composition, and physically contacts capacitor plate material 94. The same numbering is utilized for the structures of FIG. 11 as is utilized for the structures of FIG. 10. The construction of FIG. 11, like that of FIG. 10, may be considered to be a portion of a DRAM array.

Figure 12:
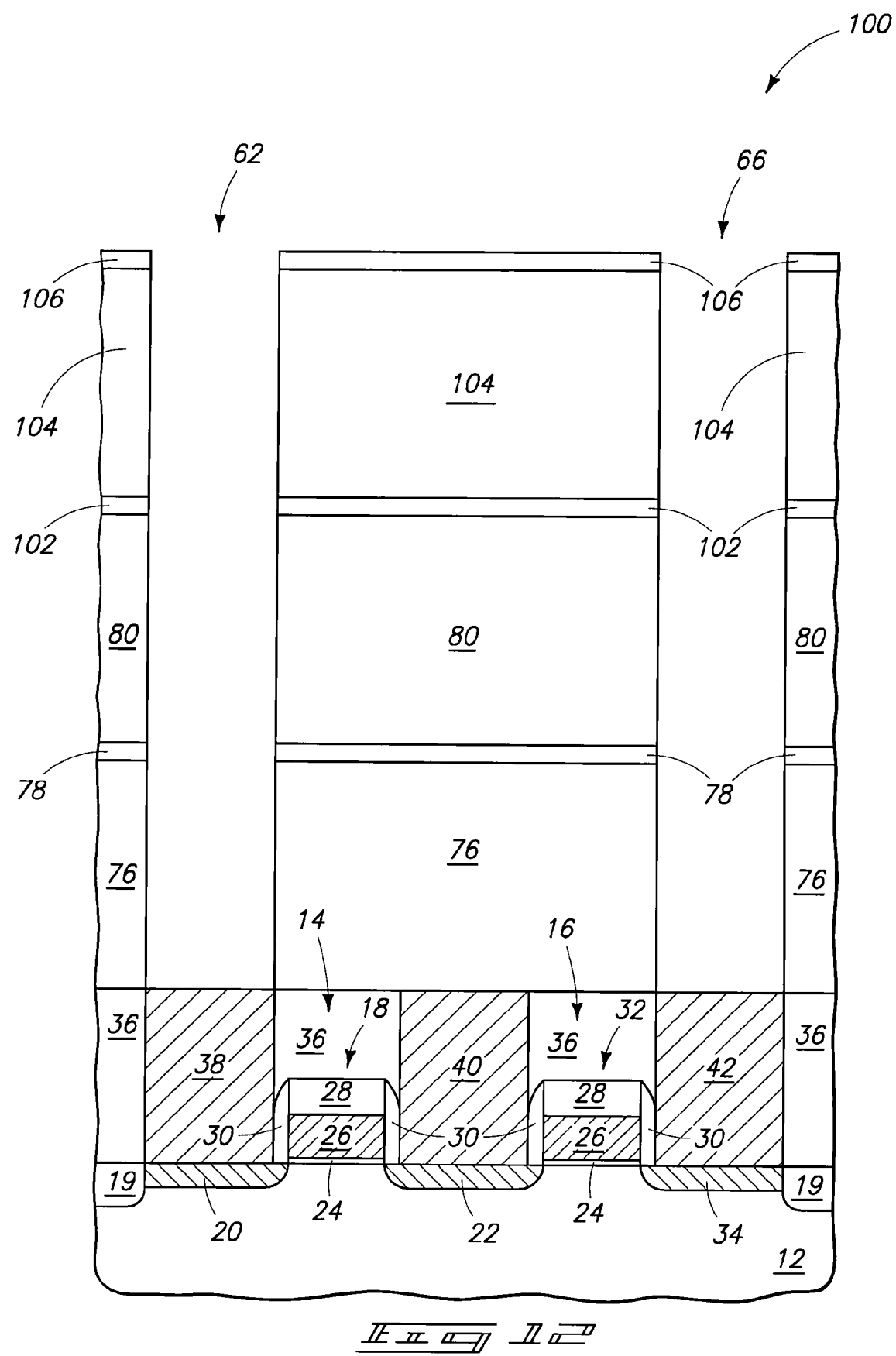
FIGS. 12 and 13 are diagrammatic, cross-sectional views of a portion of a semiconductor construction at various process stages in accordance with an embodiment.

The embodiments of FIGS. 3-11 have two layers of lattice material (78 and 82), and a single layer of non-oxidized silicon (80). In other embodiments, more than two layers of lattice material may be formed, and more than one layer of non-oxidized silicon may be formed. For instance, FIG. 12 shows a construction, 100 comprising three layers of lattice material and two layers of non-oxidized silicon. In referring to FIG. 12, similar numbering will be used as is utilized above described FIGS. 3-11, where appropriate.

Construction 100 comprises the oxide-containing material 76, first material 78, and non-oxidized silicon-containing material 80 discussed above. The first material 78 may be considered a first lattice material, and construction 100 further comprises a second lattice material 102 over non-oxidized silicon-containing material 80. Additionally, construction 100 comprises a second non-oxidized silicon-containing material 104 over the second lattice material, and comprises a third lattice material 106 over material 104.

The lattice material 106 may comprise any of the compositions as discussed above relative to capping layer 82, and/or may comprise a common composition as one or both of lattice materials 78 and 102. In some embodiments, all of the lattice materials 78, 102 and 106 will be the same composition as one another, and will all comprise, consist essentially of, or consist of silicon nitride.

The materials 78, 80, 102, 104, and 106 may be referred to as first, second, third, fourth and fifth materials, respectively, in some embodiments.

The materials 80 and 104 may be the same composition as one another, and may both comprise, consist essentially of, or consist of one or both of polycrystalline silicon and amorphous silicon; and may or may not be conductively-doped.

Figure 13:
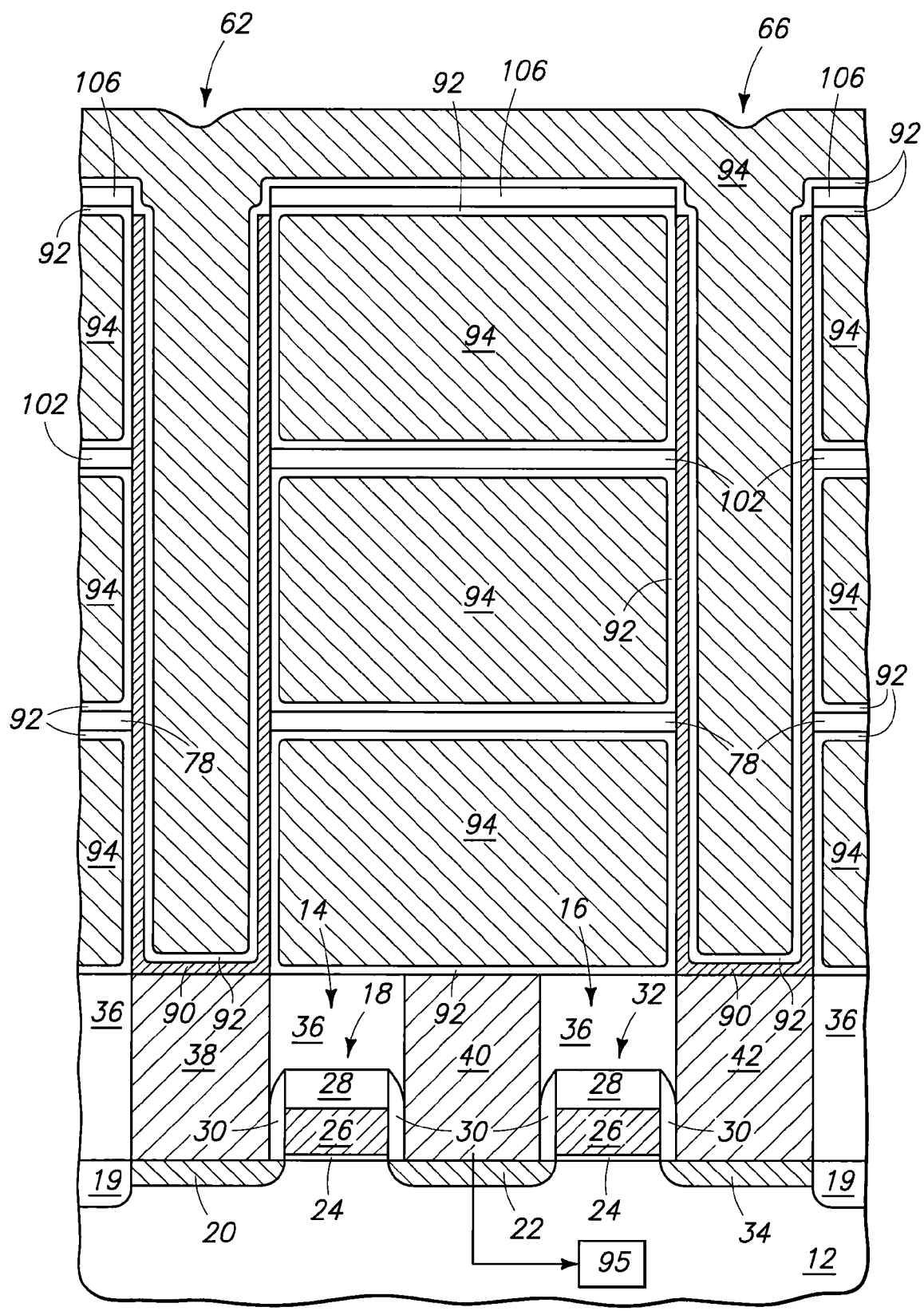

In subsequent processing, capacitors may be formed within the openings 62 and 66 of construction 100, and such capacitors may be, for example, analogous to the capacitors of FIG. 10 or the capacitors of FIG. 11. FIG. 13 shows construction 100 after formation of capacitors analogous to those of FIG. 10, and thus shows a portion of a DRAM array.

The various constructions discussed above may be utilized in electronic systems, such as cars, airplanes, cell phones, computers, etc.

Figure 14:
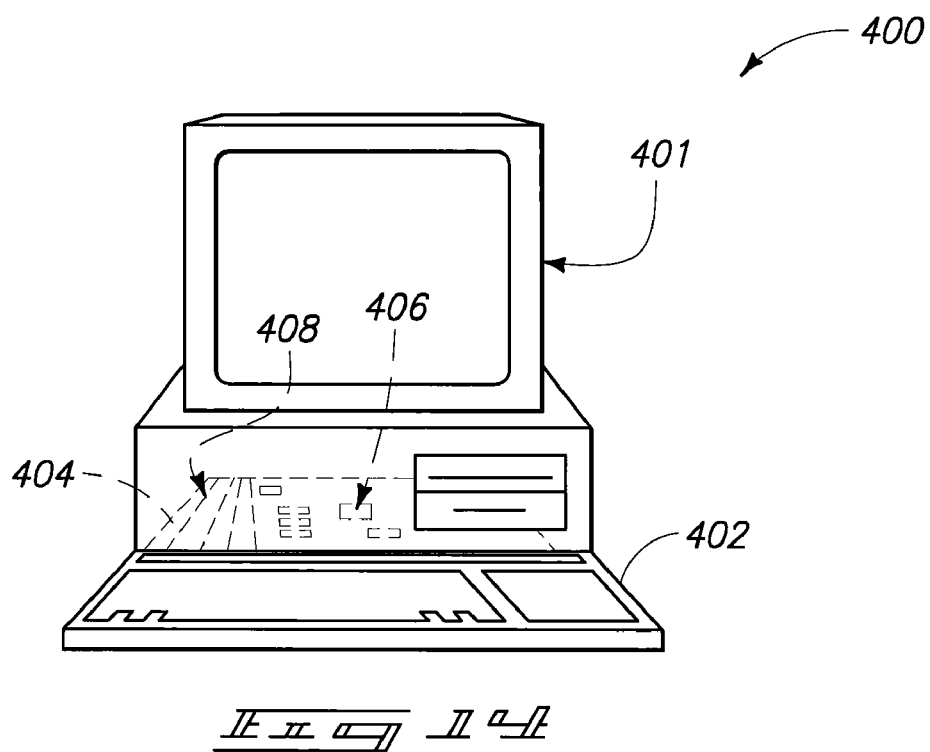
FIG. 14 is a diagrammatic view of a computer embodiment.
Figure 15:
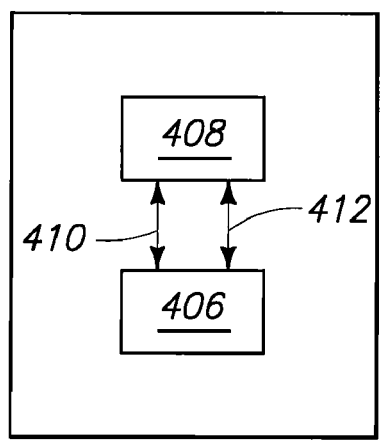
FIG. 15 is a block diagram showing particular features of the motherboard of the FIG. 13 computer embodiment.

FIG. 14 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 15. In such block diagram, the addressing circuitry is illustrated as 410 and the read circuitry is illustrated as 412.

Processor device 406 may correspond to a processor module, and associated memory utilized with the module may comprise DRAM formed in accordance with embodiments disclosed herein.

Memory device 408 may correspond to a memory module, and may comprise DRAM formed in accordance with embodiments disclosed herein.

Figure 16:
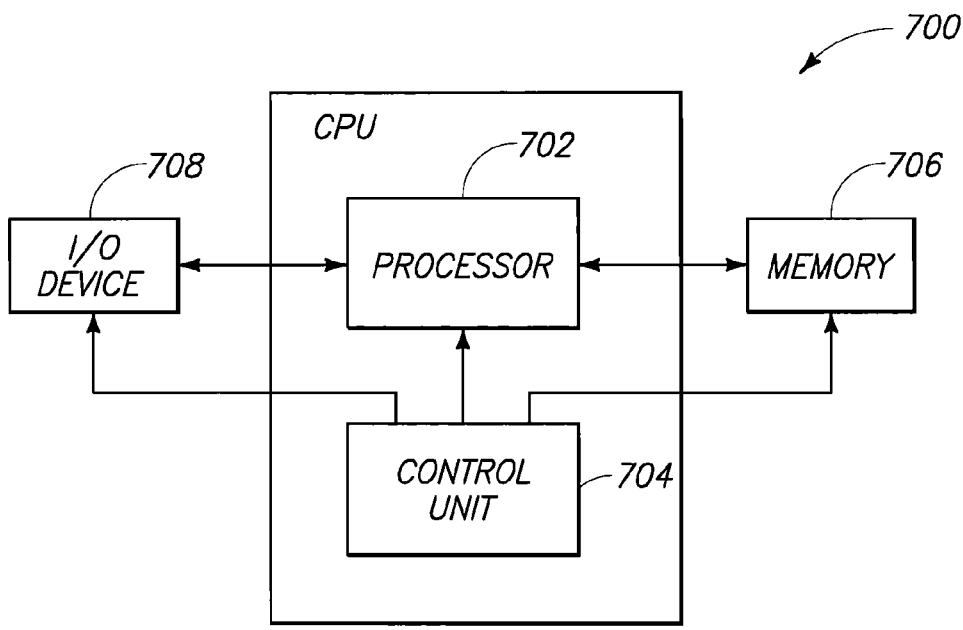
FIG. 16 is a high level block diagram of an electronic system embodiment.

FIG. 16 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include DRAM formed in accordance with embodiments disclosed herein.

Figure 17:
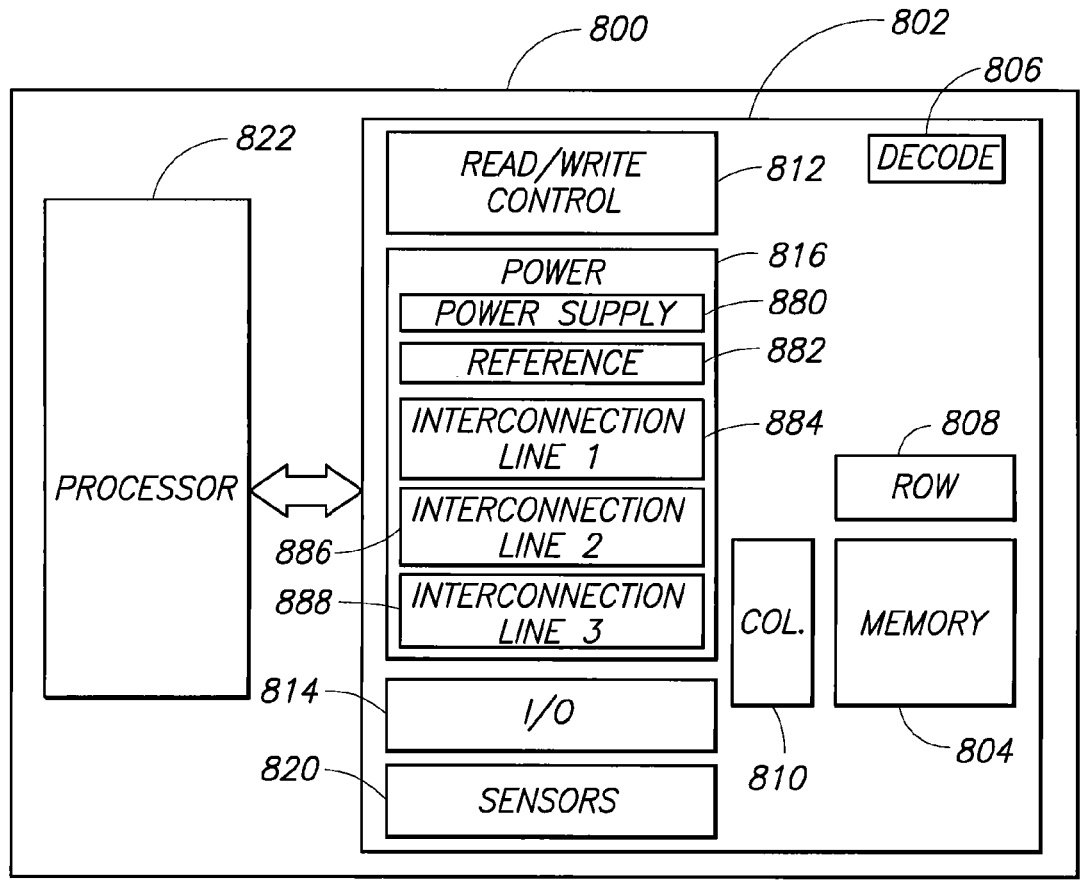
FIG. 17 is a simplified block diagram of a memory device embodiment.

FIG. 17 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include DRAM formed in accordance with embodiments disclosed herein.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a semiconductor construction, comprising:
    forming a silicon dioxide-containing material over a semiconductor substrate;
    forming a first material over and directly against the silicon dioxide-containing material;
    forming a second material over and directly against the first material, the silicon dioxide-containing material and the first material being selectively etchable relative to the second material, the second material consisting of one or both of polycrystalline silicon and amorphous silicon;
    forming a third material over the second material;
    forming a patterned mask over the third material; and
    transferring a pattern from the mask through the first material, second material, third material, and silicon dioxide-containing material with one or more suitable etches to form openings extending through the first material, second material, third material, and silicon dioxide-containing material.

2. The method of claim 1 wherein the first and third materials consist of silicon nitride.

3. The method of claim 1 wherein the first material consists of silicon nitride and wherein the third material comprises a composition other than silicon nitride.

4. The method of claim 3 wherein the third material comprises an electrically conductive composition.

5. The method of claim 4 further comprising:
    forming capacitor storage node material within the openings;
    forming capacitor dielectric material over the capacitor storage node material; and
    utilizing the electrically conductive third material as capacitor plate material for capacitors comprising the capacitor storage node material and the dielectric material.

6. The method of claim 1 further comprising forming a fourth material over the third material, and forming a fifth material over the fourth material; and wherein:
    the fourth material is identical in composition to the second material; and
    the transferring the pattern comprises transferring the pattern through the first material, second material, third material, fourth material, fifth material and silicon dioxide-containing material to form the openings to extend through the first material, second material, third material, fourth material, fifth material and silicon dioxide-containing material.

7. The method of claim 6 wherein the first, third and fifth materials consist of silicon nitride.

8. The method of claim 1 further comprising:
forming capacitor storage node material within the openings;
forming capacitor dielectric material over the capacitor storage node material; and
forming capacitor plate material over the capacitor dielectric material.

9. A method of forming a semiconductor construction, comprising:
forming an oxide over a semiconductor substrate, the oxide having a thickness of at least about 10,000 Å;
forming an electrically insulative nitride over the oxide;
forming silicon-containing material over the nitride, the silicon-containing material consisting of one or both of polycrystalline silicon and amorphous silicon, the silicon-containing material having a thickness of at least about 3,000 Å;
forming a capping material over the silicon-containing material;
forming a patterned mask over the capping material; and
transferring a pattern from the mask through the capping material, silicon-containing material, nitride, and oxide with one or more suitable etches to form openings extending through the capping material, silicon-containing material, nitride, and oxide.

10. The method of claim 9 wherein the capping material is electrically conductive.

11. The method of claim 9 wherein the capping material is electrically insulative.

12. The method of claim 9 wherein the silicon-containing material is directly against the nitride; wherein the capping material is directly against the silicon-containing material, and wherein the capping material comprises an electrically insulative nitride.

13. A method of forming a semiconductor construction, comprising:
forming a silicon dioxide-containing material over a semiconductor base material;
forming a first silicon nitride-containing material over the silicon dioxide-containing material;
forming a non-oxidized silicon material over and directly against the first silicon nitride-containing material;
forming a second silicon nitride-containing material over and directly against the non-oxidized silicon material; and
providing a patterned mask over the second silicon nitride-containing material, and transferring the pattern from the mask into the underlying materials to form openings extending through said materials, the transferring of the pattern comprising:
etching through the second silicon nitride-containing material with a first etch;
etching through the non-oxidized silicon material with a second etch;
etching through the first silicon nitride-containing material with a third etch; and
etching through the silicon dioxide-containing material with a fourth etch.

14. The method of claim 13 wherein the first and third etches utilize identical conditions as one another.

15. The method of claim 13 further comprising:
forming capacitor storage node material within the openings;
forming capacitor dielectric material over the capacitor storage node material; and
forming capacitor plate material over the capacitor dielectric material.

16. A method of forming a semiconductor construction, comprising:
forming a silicon dioxide-containing material over a semiconductor substrate;
forming a first silicon nitride-containing material over the silicon dioxide-containing material;
forming a silicon-containing material over the silicon nitride-containing material, the silicon-containing material comprising one or both of polycrystalline silicon and amorphous silicon;
forming a second silicon nitride-containing material over the silicon-containing material;
forming transparent carbon over the second silicon nitride-containing material;
forming silicon oxynitride over the transparent carbon;
forming a carbon-containing antireflective coating over the silicon oxynitride;
forming patterned photoresist mask over the carbon-containing antireflective coating;
transferring a pattern from the photoresist mask to the transparent carbon;
transferring the pattern through the transparent carbon with a dry etch;
transferring the pattern through the second silicon nitride-containing material with a first nitride etch;
transferring the pattern through the silicon-containing material with a silicon etch;
transferring the pattern through the first silicon nitride-containing material and partially into the silicon dioxide-containing material with a second nitride etch; and
transferring the pattern through a remaining portion of the silicon dioxide-containing material with an oxide etch; the pattern within the silicon dioxide-containing material, first silicon nitride-containing material, silicon-containing material, and second silicon nitride-containing material forming a plurality of openings.

17. The method of claim 16 wherein the silicon etch utilizes an oxygen-containing reactant.

18. The method of claim 16 wherein:
the silicon dioxide-containing material has a thickness of from about 10,000 Å to about 20,000 Å; and the silicon-containing material has a thickness of from about 3,000 Å to about 10,000 Å.

19. The method of claim 16 wherein:
the silicon dioxide-containing material has a thickness of from about 10,000 Å to about 20,000 Å;
the first silicon nitride-containing material has a thickness of from about 250 Å to about 500 Å;
the silicon-containing material has a thickness of from about 3,000 Å to about 10,000 Å; and
the second silicon nitride-containing material has a thickness of from about 1000 Å to about 1500 Å.

20. The method of claim 16 further comprising:
forming capacitor storage node material within the openings;
forming capacitor dielectric material over the capacitor storage node material; and
forming capacitor plate material over the capacitor dielectric material.

* * * * *